(12) United States Patent
Shu

(10) Patent No.: US 8,514,121 B1
(45) Date of Patent: Aug. 20, 2013

(54) COMPARISON CIRCUITS

(75) Inventor: Yun-Shiang Shu, Zhubei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/430,464

(22) Filed: Mar. 26, 2012

(51) Int. Cl.
  *H03M 1/12* (2006.01)
(52) U.S. Cl.
  USPC .......................................... 341/155; 341/156
(58) Field of Classification Search
  USPC ................. 341/155, 158, 166, 156, 159
  See application file for complete search history.

(56) References Cited

U.S. PATENT DOCUMENTS 7,557,746 B1    7/2009 Waltari
7,561,092 B2 *  7/2009 Tero .............................. 341/158

* cited by examiner

*Primary Examiner* — Joseph Lauture
(74) *Attorney, Agent, or Firm* — McClure, Qualey & Rodack, LLP

(57) ABSTRACT

A comparison circuit is provided and includes first and second comparators and a first time-to-digital comparator. The first comparator with a first offset voltage receives an input signal and generates a first comparison signal and a first inverse comparison signal. The second comparator receives the input signal and generates a second comparison signal and a second inverse comparison signal. The first offset voltage is larger than the second offset voltage. The first time-to-digital comparator receives the first comparison signal and the second inverse comparison signal and generates first and second determination signals according to the first comparison signal and the second inverse comparison signal. The first and second determination signals indicate whether a voltage of the input signal is larger than a first middle voltage. The first middle voltage is equal to a half of the sum of the first offset voltage and the second offset voltage.

19 Claims, 8 Drawing Sheets

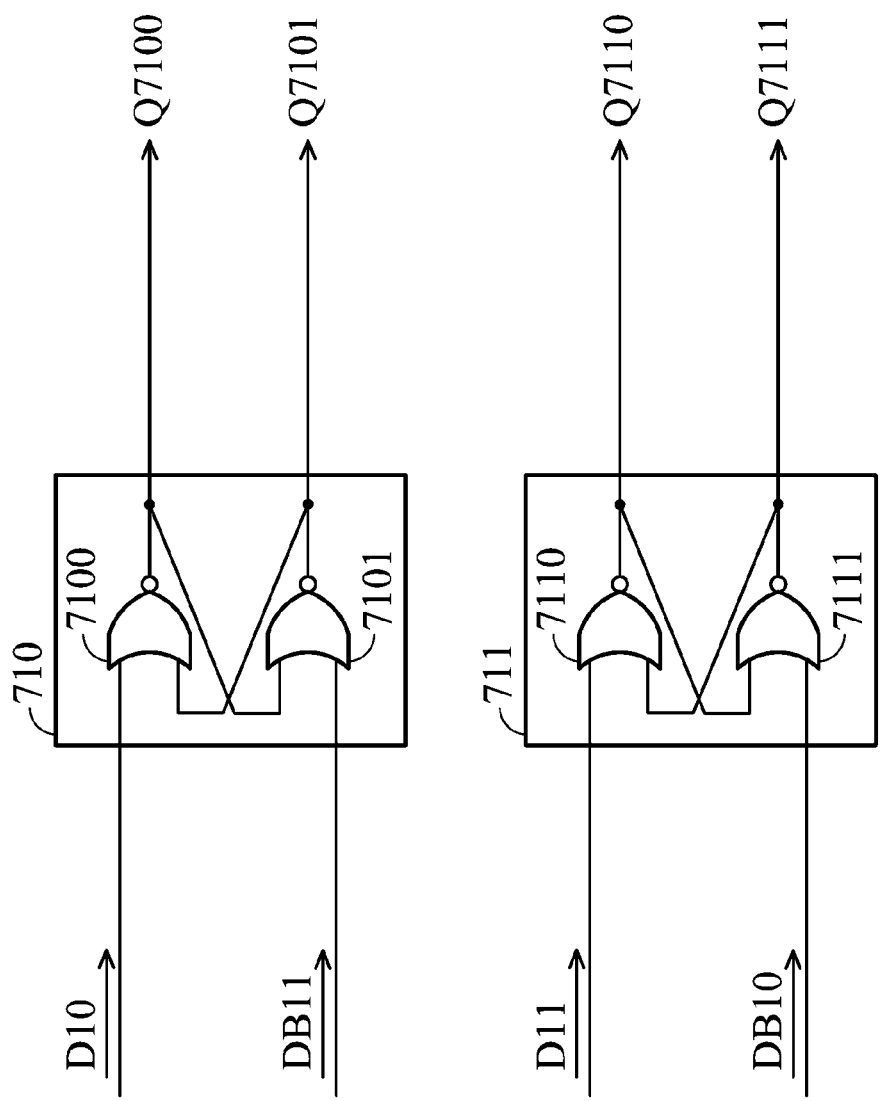

COMPARISON CIRCUITS

BACKGROUND OF THE INVENTION

1. Field of the Invention

The invention relates to a comparison circuit, and more particularly to a comparison circuit with an offset averaging scheme.

2. Description of the Related Art

Comparators are widely applied for analog-to-digital conversion. In a conventional analog-to-digital converter, three comparators are required to digitize the input signal into four ranges. Each of the three comparators has a threshold voltage, and the three threshold voltages comprise the largest one among the three threshold voltages, the smallest one among the three threshold voltages, and the middle one between the largest threshold voltage and the smallest threshold voltage. Thus, the four ranges are: the range higher than the largest threshold voltage, the range between the largest threshold voltage and the middle threshold voltage, the range between the middle threshold voltage and the smallest threshold voltage, and the range lower than the smallest threshold voltage. If it is desired to provide several ranges for input signal digitization, a plurality of comparators are required, which increases the size of the analog-to-digital converter.

Thus, it is desired to provide a comparison circuit which adopts offset averaging schemes for analog-to-digital conversion and occupies minimal area. A comparator threshold of the comparison circuit in the invention is realized by comparator built-in offset (or intrinsic offset).

BRIEF SUMMARY OF THE INVENTION

An exemplary embodiment of a comparison circuit comprises a first comparator, a second comparator, and a first time-to-digital comparator. The first comparator has a first offset voltage. The first comparator receives an input signal and performs a first comparison operation to the input signal to generate a first comparison signal and a first inverse comparison signal. The second comparator has a second offset voltage. The second comparator receives the input signal and performs a second comparison circuit to the input signal to generate a second comparison signal and a second inverse comparison signal. The first offset voltage is larger than the second offset voltage. The first time-to-digital comparator receives the first comparison signal and the second inverse comparison signal and generates a first determination signal and a second determination signal according to the first comparison signal and the second inverse comparison signal. The first determination signal and the second determination signal indicate whether a voltage of the input signal is larger than a first middle voltage. The first middle voltage is equal to a half of the sum of the first offset voltage and the second offset voltage.

Another exemplary embodiment of a comparison circuit comprises a first comparator, a second comparator, a first time-to-digital comparator, and a second time-to-digital comparator. The first comparator has a first offset voltage. The first comparator receives an input signal and performs a first comparison circuit to the input signal to generate a first comparison signal and a first inverse comparison signal. The second comparator has a second offset voltage. The second comparator receives the input signal and performs a second comparison circuit to the input signal to generate a second comparison signal and a second inverse comparison signal. The first time-to-digital comparator receives the first comparison signal and the second inverse comparison signal and generates a first determination signal and a second determination signal according to the first comparison signal and the second inverse comparison signal. The second time-to-digital comparator receives the first inverse comparison signal and the second comparison signal and generates a third determination signal and a fourth determination signal according to the first inverse comparison signal and the second comparison signal. When the first offset voltage is larger than the second offset voltage, the first determination signal and the second determination signal indicate whether a voltage of the input signal is larger than a first middle voltage. When the second offset voltage is larger than the first offset voltage, the third determination signal and the fourth determination signal indicate whether the voltage of the input signal is larger than the first middle voltage. The first middle voltage is equal to a half of the sum of the first offset voltage and the second offset voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 8 shows a detailed structure of time-to-digital comparators in the comparison circuit of FIG. 7.

DETAILED DESCRIPTION OF THE INVENTION

Figure 1:
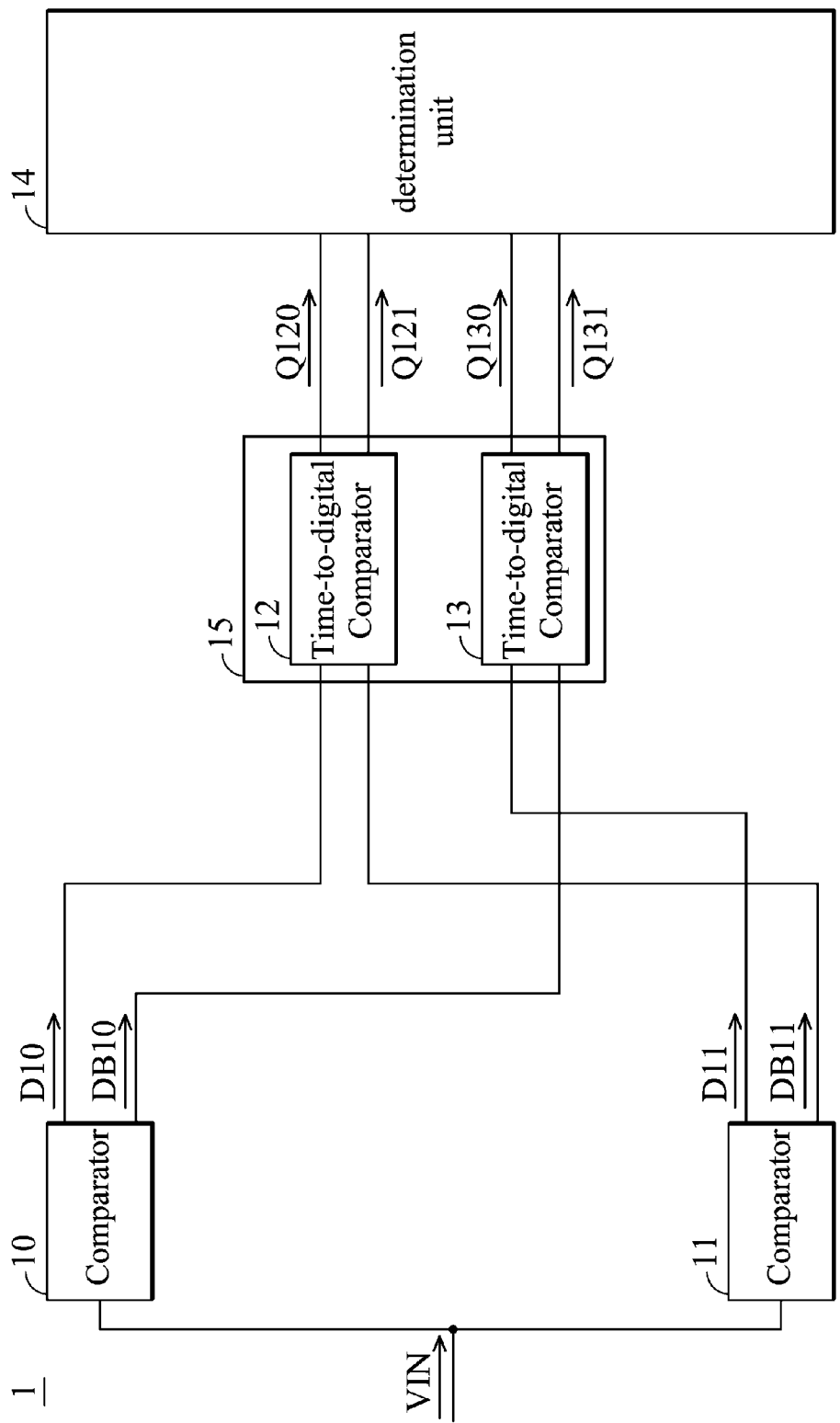
FIG. 1 shows an exemplary embodiment of a comparison circuit.

The following description is of the best-contemplated mode of carrying out the invention. This description is made for the purpose of illustrating the general principles of the invention and should not be taken in a limiting sense. The scope of the invention is best determined by reference to the appended claims.

Comparison circuits are provided. In an exemplary embodiment of a comparison circuit in FIG. 1, a comparison circuit 1 comprises comparators 10 and 11, time-to-digital comparators 12 and 13, and a determination unit 14. The comparator 10 has a built-in offset voltage (or intrinsic offset) Voffset10, while the comparator 11 has a built-in offset voltage (or intrinsic offset) Voffset11. Both of the comparators 10 and 11 receive an input signal VIN. The comparator 10 performs a comparison operation to the input signal VIN based on the offset voltage Voffset10 to generate comparison signals D10 and DB10, wherein the comparison signal DB10 is inverse to the comparison signal D10. The comparator 11 performs a comparison operation to the input signal VIN based on the offset voltage Voffset11 to generate comparison signals D11 and DB11, wherein the comparison signal DB11 is inverse to the comparison signal D11. A half of the sum of the offset voltages Voffset10 and Voffset11 is defined as a first middle voltage (e.g., =(Voffset10+Voffset11)/2).

The time-to-digital comparator 12 receives the comparison signal D10 and the inverse comparison signal DB11 and generates determination signals Q120 and Q121 according to the comparison signal D10 and the inverse comparison signal DB11. The time-to-digital comparator 13 receives the inverse comparison signal DB10 and the comparison signal D11 and generates determination signals Q130 and Q131 according to the inverse comparison signal DB10 and the comparison signal D11. The determination unit 14 receives the determination signals Q120, Q121, Q130, and Q131. In the case when the offset voltage Voffset10 is larger than the offset voltage Voffset11, the determination unit 14 determines whether the voltage of the input signal VIN is larger than the first middle voltage according to the determination signals Q120 and Q121. In the case when the offset voltage Voffset11 is larger than the offset voltage Voffset10, the determination unit 14 determines whether the voltage of the input signal VIN is larger than the first middle voltage according to the determination signals Q130 and Q131. In the embodiment, each of the comparators 10 and 11 is implemented with a sense amplifier-based flip-flop without a reference signal for comparison.

Figure 2:
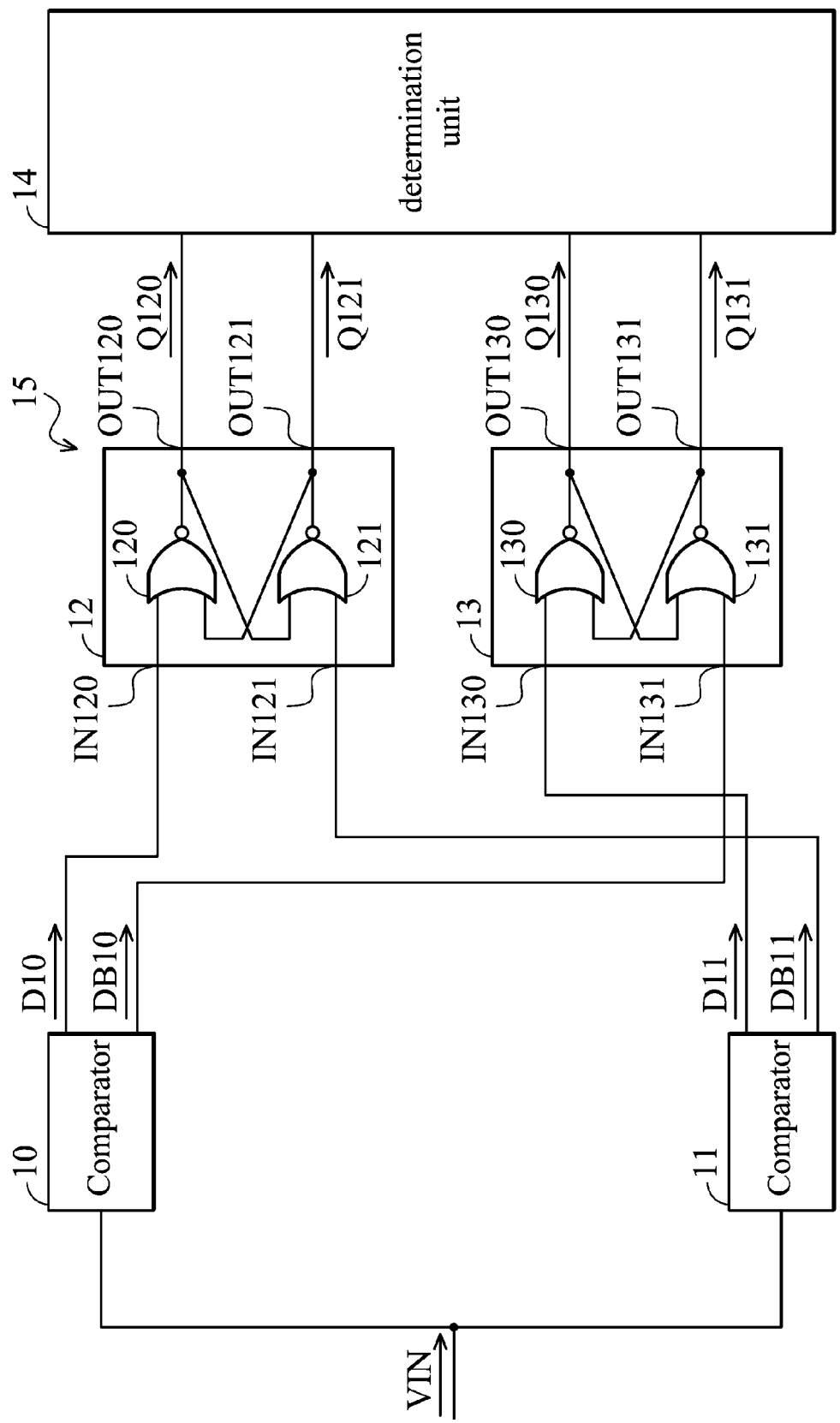
FIG. 2 shows a detailed structure of time-to-digital comparators in the comparison circuit of FIG. 1.

FIG. 2 shows a detailed structure of the time-to-digital comparators 12 and 13. In order to describe the operation of the comparison circuit 1, FIG. 2 also shows the comparators 10 and 11 and the determination unit 14. In the embodiment, each of the time-to-digital comparators 12 and 13 is implemented by an SR latch and has two input nodes and two output nodes. Referring to FIG. 2, the SR latch 12 receives the comparison signal D10 and the inverse comparison signal DB11 respectively at the input nodes IN120 and IN121 and generates the determination signals Q120 and Q121 respectively at the output nodes OUT120 and OUT121. The SR latch 12 comprises NOR gates 120 and 121. One input terminal of the NOR gate 120 is coupled to the input node IN120, the other input terminal thereof is coupled to the output node OUT121, and an output terminal thereof is coupled to the output node OUT120. One input terminal of the NOR gate 121 is coupled to the output node OUT120, the other input terminal thereof is coupled to the input node IN121, and an output terminal thereof is coupled to the output node OUT121. The SR latch 13 receives the comparison signal D11 and the inverse comparison signal DB10 respectively at the input nodes IN130 and IN131 and generates the determination signals Q130 and Q131 respectively at the output nodes OUT130 and OUT131. The SR latch 13 comprises NOR gates 130 and 131. One input terminal of the NOR gate 130 is coupled to the input node IN130, the other input terminal thereof is coupled to the output node OUT131, and an output terminal thereof is coupled to the output node OUT130. One input terminal of the NOR gate 131 is coupled to the output node OUT130, the other input terminal thereof is coupled to the input node IN131, and an output terminal thereof is coupled to the output node OUT131.

Figure 3:
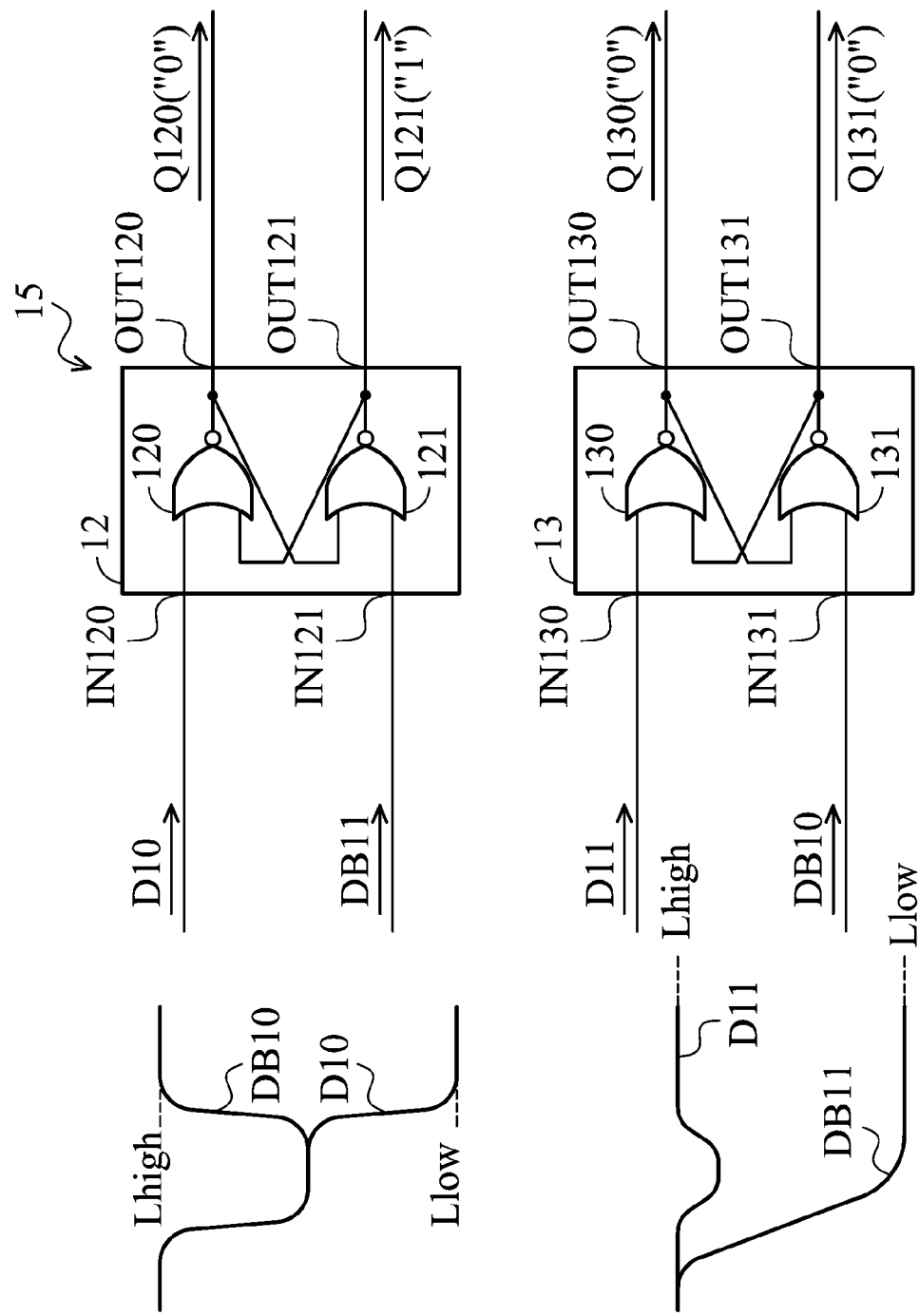
FIG. 3 is a schematic view showing the case when a voltage of an input signal is between a larger offset voltage and a middle voltage in the comparison circuit of FIG. 1.

In the following description, the detailed operation of the comparison circuit 1 will be described according to the case when the offset voltage Voffset10 is larger than the offset voltage Voffset11. Referring to FIG. 3, when the voltage of the input signal VIN is between the offset voltage Voffset10 and the first middle voltage (referred to as "range_Voffset10-Vmiddle"), since the voltage of the input signal VIN is close to the offset voltage Voffset10, the comparison signal D10 and the inverse comparison DB10 generated by the comparator 10 vary slowly to be at the final levels. The final levels of the comparison signal D10 and the inverse comparison DB10 are the levels Llow and Lhigh respectively since the voltage of the input signal VIN is less than the offset voltage Voffset10. Moreover, since the voltage of the input signal VIN is far from the offset voltage Voffset11, the comparison signal D11 and the inverse comparison DB11 generated by the comparator 11 vary quickly to be at the final levels. The final levels of the comparison signal D11 and the inverse comparison DB11 are the levels Lhigh and Llow respectively since the voltage of the input signal VIN is larger than the offset voltage Voffset11. In the embodiment, the levels Lhigh and Llow are represented by logic values "1" and "0" respectively. Thus, the SR latch 12 receives the comparison signal D10 with the logic value "0" and the inverse comparison signal DB11 with the logic value "0", while the SR latch 13 receives the comparison signal D11 with the logic value "1" and the inverse comparison signal DB10 with the logic value "1".

According to the logic operation of the SR latch 12, since the comparison signal DB11 vary quickly to be at the level Vlow, the determination signal Q121 generated by the NOR gate 121 is decided by the comparison signal DB11 to have a logic value "1". Then, the determination signal Q120 generated by the NOR gate 120 has a logic value "0" according to the comparison signal D10 with the logic value "0" and the determination signal Q121 with the logic value "1". At this time, according to the logic operation of the SR latch 13, both of the determination signals Q130 and Q131 have a logic value "0". The logic values of the determination signals Q120, Q121, Q130, and Q131 are shown in Table 1.

Figure 4:
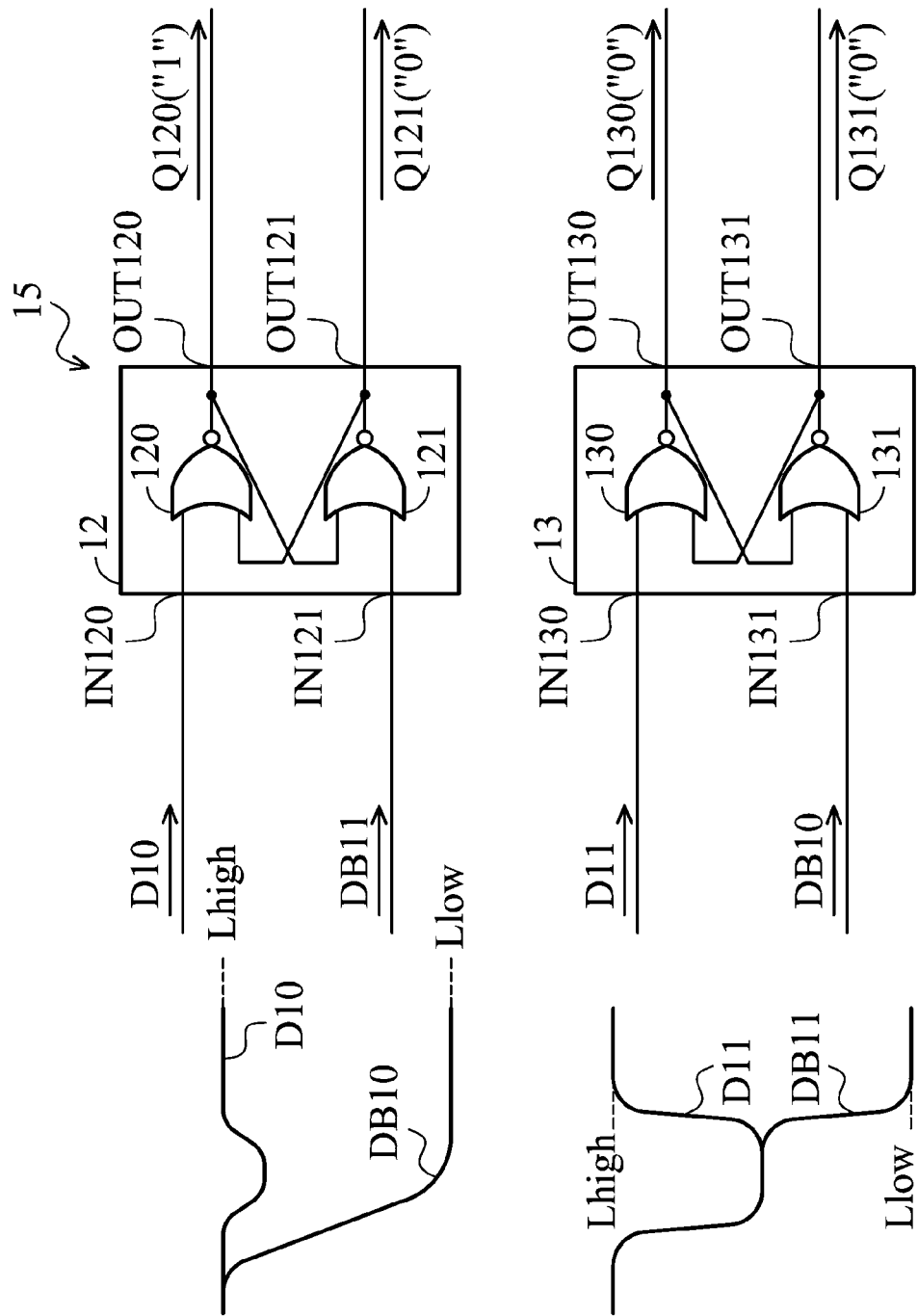
FIG. 4 is a schematic view showing the case when a voltage of an input signal is between the smaller offset voltage and a middle voltage in the comparison circuit of FIG. 1.

Referring to FIG. 4, when the voltage of the input signal VIN is between the offset voltage Voffset11 and the first middle voltage (referred to as "range_Vmiddle-Voffset11"), since the voltage of the input signal VIN is close to the offset voltage Voffset11, the comparison signal D11 and the inverse comparison DB11 generated by the comparator 11 vary slowly to be at the final levels. The final levels of the comparison signal D11 and the inverse comparison DB11 are the levels Lhigh and Llow respectively since the voltage of the input signal VIN is larger than the offset voltage Voffset11. Moreover, since the voltage of the input signal VIN is far from the offset voltage Voffset10, the comparison signal D10 and the inverse comparison DB10 generated by the comparator 10 vary quickly to be at the final levels. The final levels of the comparison signal D10 and the inverse comparison DB10 are the levels Llow and Lhigh respectively since the voltage of the input signal VIN is less than the offset voltage Voffset10. Thus, the SR latch 12 receives the comparison signal D10 with the logic value "0" and the inverse comparison signal DB11 with the logic value "0", while the SR latch 13 receives the comparison signal D11 with the logic value "1" and the inverse comparison signal DB10 with the logic value "1".

As the above describes, according to the logic operation of the SR latch 12, the determination signals Q120 and Q121 have a logic value "1" and a logic value "0" respectively. At this time, according to the logic operation of the SR latch 13, both of the determination signals Q130 and Q131 also have a logic value "0".

According to the structure of FIG. 2, when the voltage of the input signal VIN is larger than the offset voltage Voffset10 (also larger the first middle voltage, referred to as "range_>Voffset1"), the comparator 10 generates the comparison signal D10 with a logic value "1" and the inverse comparison DB10 with a logic value "0", and the comparator 11 generates the comparison signal D11 with a logic value "1" and the inverse comparison DB11 with a logic value "0". According to the logic operations of the SR latches 12 and 13, the determination signals Q120 and Q121 generated by the SR latch 12 have logic values "0" and "1" respectively, while the determination signals Q130 and Q131 generated by the SR latch 13 have logic values "0" and "1" respectively.

When the voltage of the input signal VIN is less than the offset voltage Voffset11 (also less the first middle voltage, referred to as "range<Voffset11"), the comparator 10 generates the comparison signal D10 with a logic value "0" and the inverse comparison DB10 with a logic value "1", and the comparator 11 generates the comparison signal D11 with a logic value "0" and the inverse comparison DB11 with a logic value "1". According to the logic operations of the SR latches 12 and 13, the determination signals Q120 and Q121 generated by the SR latch 12 have logic values "1" and "0" respectively, while the determination signals Q130 and Q131 generated by the SR latch 13 have logic values "1" and "0" respectively.

TABLE 1

|  | Q120 | Q121 | Q130 | Q131 |
|---|---|---|---|---|
| range_>Voffset10 | 0 | 1 | 0 | 1 |
| range_Voffset10–Vmiddle | 0 | 1 | 0 | 0 |
| range_Vmiddle–Voffset11 | 1 | 0 | 0 | 0 |
| range_<Voffset11 | 1 | 0 | 1 | 0 |

In the above embodiment, as shown in Table 1, in the case when the offset voltage Voffset10 is larger than the offset voltage Voffset11, when the voltage of the input signal VIN is larger than the first middle voltage (range_Voffset10-Vmiddle and range_$\geq$Voffset10), the determination signals Q120 and Q121 generated by the SR latch 12 have the logic values "0" and "1" respectively. When the voltage of the input signal VIN is less than the first middle voltage (range_Vmiddle-Voffset11 and range<Voffset11), the determination signals Q120 and Q121 have the logic values "1" and "0" respectively. Thus, in this case, the determination unit 14 determines whether the voltage of the input signal VIN is larger than the first middle voltage according to the determination signals Q120 and Q121.

According to the logical operation described above, in the case when the offset voltage Voffset11 is larger than the offset voltage Voffset10, the determination signals Q130 and Q131 are meaningful. The determination unit 14 determines whether the voltage of the input signal VIN is larger than the first middle voltage according to the determination signals Q130 and Q131.

According to the above embodiments, since the determination signals generated by the SR latches 12 and 13 can be used to determine whether the voltage of the input signal VIN is larger than the first middle voltage (e.g., =(Voffset10+Voffset11)/2), the SR latches 12 and 13 compose a pseudo comparator 15 with an equivalent offset voltage Voffset15, and the offset voltage Voffset15 is equal to the first middle voltage.

Compared with the prior arts, in order to determine that the voltage of the input signal VIN is at which one of the four ranges, the comparison circuit 1 comprises two comparators 10 and 11. The area of the pseudo comparator 15 is much smaller than one of the comparators 10 and 11. Thus, when the comparison circuit 1 is applied in an analog-to-digital converter, the size of the analog-to-digital converter may be decreased. Moreover, since less comparators are required, the comparison circuit 1 consumes less power.

Figure 5:
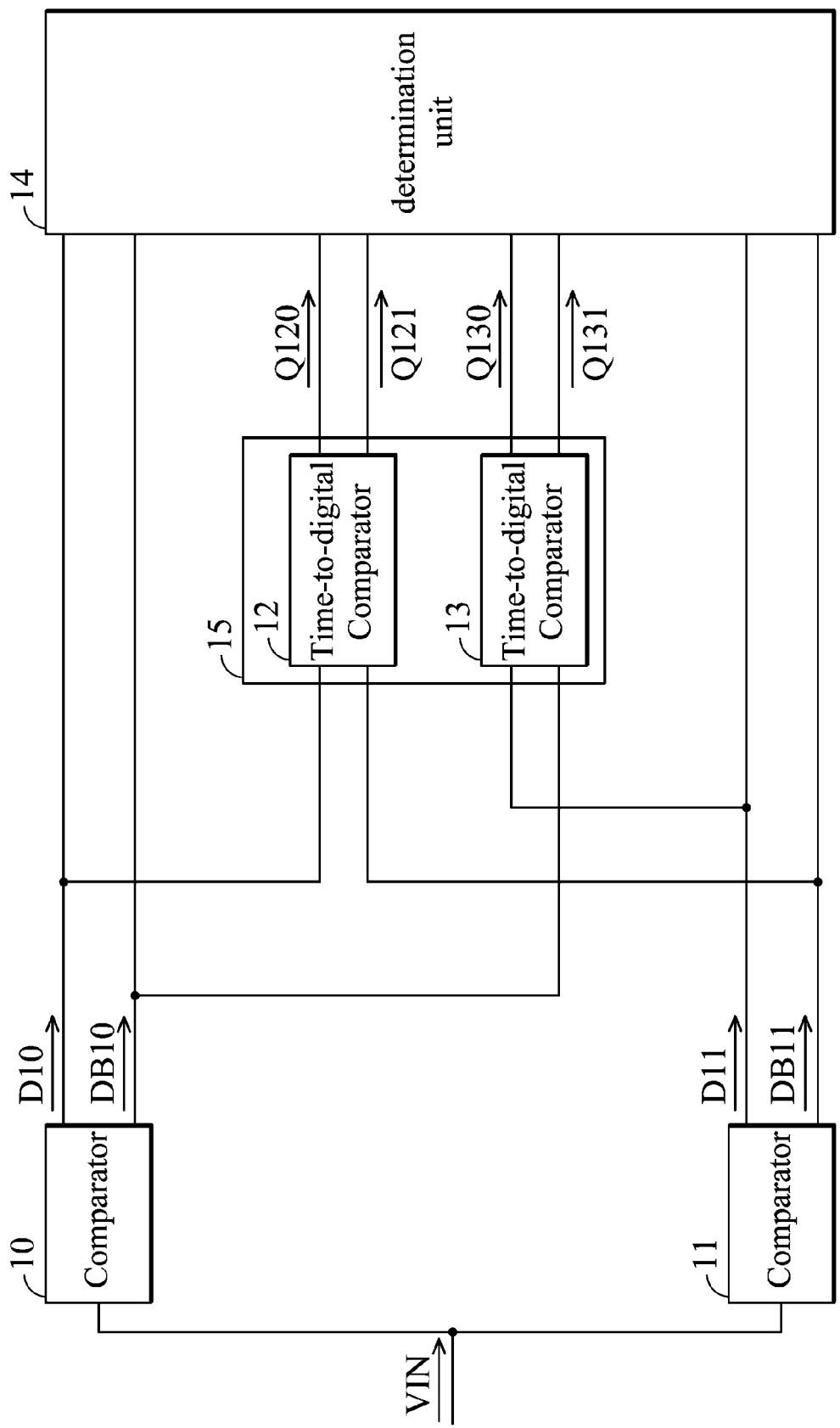
FIG. 5 shows another exemplary embodiment of a comparison circuit.

In the above embodiments, whether the offset voltage Voffset10 is larger than the offset voltage Voffset11 does not matter, as the determination unit 14 only determines the relationship between the voltage of the input signal VIN and the first middle voltage. Referring to FIG. 5, in another embodiment, the determination unit 14 may further receive the comparison signal D10 and the inverse comparison DB10 from the comparator 10 and the comparison signal D11 and the inverse comparison DB11 from the comparator 11. Accordingly, the determination unit 14 can further determine the relationship between the voltage of the input signal VIN and the offset voltage Voffset10 and the relationship between the voltage of the input signal VIN and the offset voltage Voffset11.

In the case when the offset voltage Voffset10 is larger than the offset voltage Voffset11, the determination unit 14 can determine that the voltage of the input signal VIN is at range_>Voffset10, range_Voffset10-Vmiddle, range_Vmiddle-Voffset11, or range_<Voffset11. As the above description, the comparison signal D10 and the inverse comparison signal DB10 have the logic values "1" and "0" respectively when the voltage of the input signal VIN is larger than the offset voltage Voffset10, while the comparison signal D10 and the inverse comparison signal DB10 have the logic values "0" and "1" respectively when the voltage of the input signal VIN is less than the offset voltage Voffset10. Thus, when the determination unit 14 determines that the voltage of the input signal VIN is larger than the first middle voltage according to the determinations signals Q120 and Q121, the determination unit 14 can determine whether the voltage of the input signal VIN is larger than the offset voltage Voffset10 according to the comparison signal D10 and the inverse comparison signal DB10.

As the above description, the comparison signal D11 and the inverse comparison signal DB11 have the logic values "1" and "0" respectively when the voltage of the input signal VIN is larger than the offset voltage Voffset11, while the comparison signal D11 and the inverse comparison signal DB11 have the logic values "0" and "1" respectively when the voltage of the input signal VIN is less than the offset voltage Voffset11. Thus, when the determination unit 14 determines that the voltage of the input signal VIN is not larger than the first middle voltage according to the determinations signals Q120 and Q121, the determination unit 14 further determines whether the voltage of the input signal VIN is larger than the offset voltage Voffset11 according to the comparison signal D11 and the inverse comparison signal DB11.

In the case when the offset voltage Voffset11 is larger than the offset voltage Voffset10, the determination unit 14 determines whether voltage of the input signal VIN is larger than the first middle voltage according to the determination signals Q130 and Q131. Similarly, the determination unit 14 can further determine whether the voltage of the input signal VIN is larger than the offset voltage Voffset10 according to the comparison signal D10 and the inverse comparison signal DB10 and whether the voltage of the input signal VIN is larger than the offset voltage Voffset11 according to the comparison signal D11 and the inverse comparison signal DB11.

Figure 6:
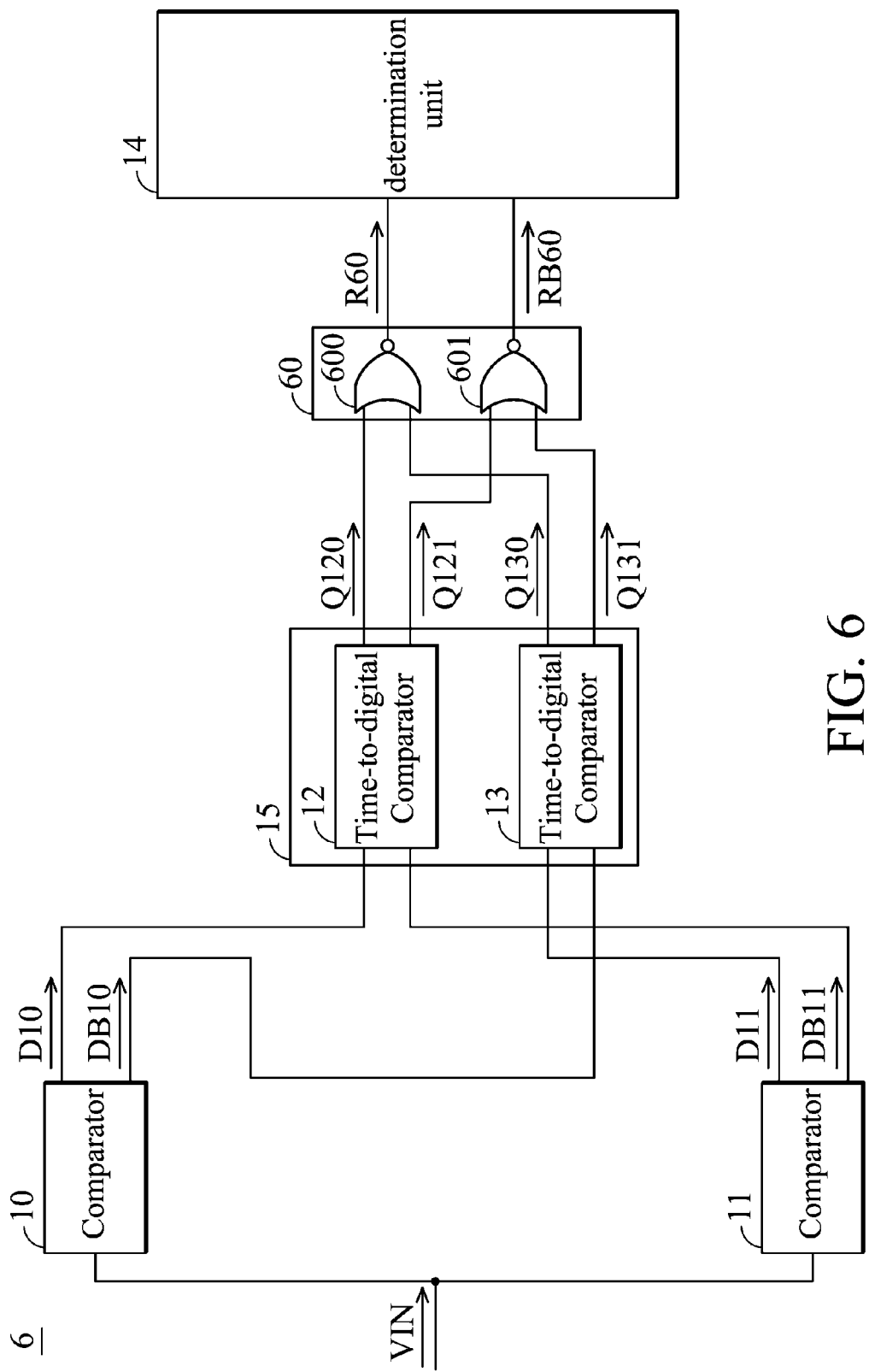
FIG. 6 shows another exemplary embodiment of a comparison circuit.

FIG. 6 shows another exemplary embodiment of a comparison circuit. Referring to FIGS. 1 and 6, the difference between FIGS. 1 and 6 is that the comparison circuit 6 further comprises a calculation unit 60. The calculation unit 60 comprises NOR gates 600 and 601. One input terminal of the NOR gate 600 receives the determination signal Q120, the other input terminal thereof receives the determination signal Q130, and an output terminal thereof generates a result signal R60. One input terminal of the NOR gate 601 receives the determination signal Q121, the other input terminal thereof receives the determination signal Q131, and an output terminal thereof generates an inverse result signal RB60. The result signal R60 and the inverse result signal RB60 indicate whether the voltage of the input signal VIN is larger than the first middle voltage. The determination unit 14 determines whether the voltage of the input signal VIN is larger than the first middle voltage according to the result signals R60 and RB60 no matter whether the offset voltage Voffset10 is larger or not larger than the offset voltage Voffset11. In the embodiment, the result signal R60 with a logic value "1" and the inverse result signal RB60 with a logic value "0" indicate that the voltage of the input signal VIN is larger than the first middle voltage, while the result signal R60 with a logic value "0" and the inverse result signal RB60 with a logic value "1" indicate that the voltage of the input signal VIN is not larger than the first middle voltage.

Figure 7:
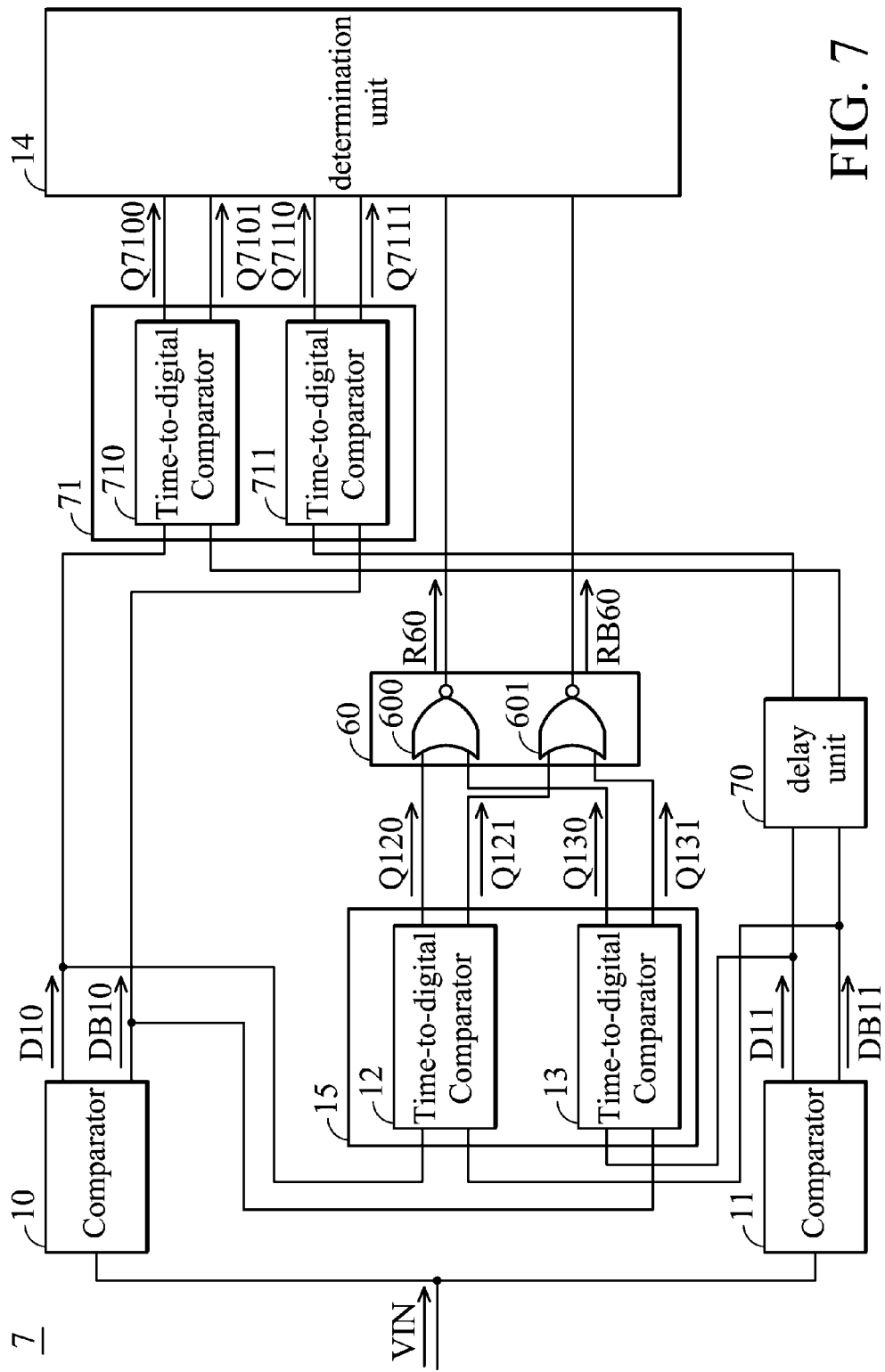
FIG. 7 shows further another exemplary embodiment of a comparison circuit.

FIG. 7 shows further another exemplary embodiment of a comparison circuit. Referring to FIGS. 6 and 7, the difference between the comparison circuits 6 and 7 is that the comparison circuit 7 further comprises a delay unit 70 and a pseudo comparator 71. The delay unit 70 receives the comparison signal D11 and the inverse comparison signal DB11 and delays the comparison signal D11 and the inverse comparison signal DB11 by a predetermined period. The pseudo comparator 71 receives the comparison signal D10 and the inverse comparison signal DB10 and the comparison signal D11 and the inverse comparison signal DB11 from the delay unit 70. Referring to FIG. 7, the pseudo comparator 71 comprises time-to-digital comparators 710 and 711. The time-to-digital comparator 710 receives the comparison signal D10 and the inverse comparison signal DB11 from the delay unit 70 and generates determination signals Q7100 and Q7101 according to the comparison signal D10 and the inverse comparison signal DB11. The time-to-digital comparator 711 receives the inverse comparison signal DB10 and the comparison signal D11 from the delay unit 70 and generates determination signals Q7110 and Q7111 according to the inverse comparison signal DB10 and the comparison signal D11. The determination unit 14 further receives the determination signals Q7100, Q7101, Q7110, and Q7111. In the case when the offset voltage Voffset10 is larger than the offset voltage Voffset11, the determination unit 14 determines whether the voltage of the input signal VIN is larger than a second middle voltage between the offset voltages Voffset10 and Voffset11 according to the determination signals Q7100 and Q7101. In the case when the offset voltage Voffset11 is larger than the offset voltage Voffset10, the determination unit 14 determines whether the voltage of the input signal VIN is larger than the second middle voltage according to the determination signals Q7110 and Q7111. The second middle voltage is preferably determined according to the predetermined period of the delay unit 70. In the embodiment of FIG. 7, the second middle voltage is defined as a half of the sum of the offset voltage Voffset10 and the first middle voltage is defined as the second middle voltage (=[Voffset10+(Voffset10+Voffset11)/2]/2) according to the predetermined period of the delay unit 70.

Referring to FIG. 8, which has the same time-to-digital comparators 12 and 13 of the pseudo comparator 15, and each of the time-to-digital comparators 710 and 711 is implemented by an SR latch. The SR latch 710 comprises NOR gates 7100 and 7101, and the SR latch 711 comprises NOR gates 7110 and 7111. The structures and operations of the SR latches 710 and 711 are same as the SR latches 12 and 13. Thus, related descriptions are omitted here.

According to the embodiment of FIG. 7, since the determination signals generated by the SR latches 710 and 711 can be used to determine whether the voltage of the input signal VIN is larger than the second middle voltage, the pseudo comparator 71 composed of the SR latches 710 and 711 has an equivalent offset voltage Voffset71 which is equal to the second middle voltage.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparison circuit comprising:
    a first comparator with a first offset voltage for receiving an input signal and performing a first comparison operation to the input signal to generate a first comparison signal and a first inverse comparison signal;
    a second comparator with a second offset voltage for receiving the input signal and performing a second comparison operation to the input signal to generate a second comparison signal and a second inverse comparison signal, wherein the first offset voltage is larger than the second offset voltage; and
    a first time-to-digital comparator for receiving the first comparison signal and the second inverse comparison signal and generating a first determination signal and a second determination signal according to the first comparison signal and the second inverse comparison signal,
    wherein the first determination signal and the second determination signal indicate whether a voltage of the input signal is larger than a first middle voltage, and
    wherein the first middle voltage is equal to a half of the sum of the first offset voltage and the second offset voltage.

2. The comparison circuit as claimed in claim 1, wherein the first time-to-digital comparator is implemented by an SR latch.

3. The comparison circuit as claimed in claim 2, wherein the first time-to-digital comparator generates the first determination signal and the second determination signal respectively at a first output node and a second output node and comprises:
    a first NOR gate having a first input terminal receiving the first comparison signal, a second input terminal coupled to the second output node, and an output terminal coupled to the first output node; and
    a second NOR gate having a first input terminal coupled to the first output node, a second input terminal receiving the second inverse comparison signal, and an output terminal coupled to the second output node.

4. The comparison circuit as claimed in claim 1 further comprising:
    a determination unit for receiving the first determination signal and the second determination signal and determining whether the voltage of the input signal is larger than the first middle voltage according to the first determination signal and the second determination signal.

5. The comparison circuit as claimed in claim 4,
    wherein the determination unit further receives the first comparison signal and the first inverse comparison signal, and
    wherein when the determination unit determines that the voltage of the input signal is larger than the first middle voltage, the determination unit determines whether the voltage of the input signal is larger than the first offset voltage according to the first comparison signal and the first inverse comparison signal.

6. The comparison circuit as claimed in claim 4,
    wherein the determination unit further receives the second comparison signal and the second inverse comparison signal, and wherein when the determination unit determines that the voltage of the input signal is not larger than the first middle voltage, the determination unit determines whether the voltage of the input signal is larger than the second offset voltage according to the second comparison signal and the second inverse comparison signal.

7. A comparison circuit comprising:
a first comparator with a first offset voltage for receiving an input signal and performing a first comparison operation to the input signal to generate a first comparison signal and a first inverse comparison signal;
a second comparator with a second offset voltage for receiving the input signal and performing a second comparison operation to the input signal to generate a second comparison signal and a second inverse comparison signal;
a first time-to-digital comparator for receiving the first comparison signal and the second inverse comparison signal and generating a first determination signal and a second determination signal according to the first comparison signal and the second inverse comparison signal; and
a second time-to-digital comparator for receiving the first inverse comparison signal and the second comparison signal and generating a third determination signal and a fourth determination signal according to the first inverse comparison signal and the second comparison signal,
wherein when the first offset voltage is larger than the second offset voltage, the first determination signal and the second determination signal indicate whether a voltage of the input signal is larger than a first middle voltage,
wherein when the second offset voltage is larger than the first offset voltage, the third determination signal and the fourth determination signal indicate whether the voltage of the input signal is larger than the first middle voltage,
wherein the first middle voltage is equal to a half of the sum of the first offset voltage and the second offset voltage.

8. The comparison circuit as claimed in claim 7, wherein each of the first time-to-digital comparator and the first time-to-digital comparator is implemented by an SR latch.

9. The comparison circuit as claimed in claim 8, wherein each of the first time-to-digital comparator and the second time-to-digital comparator has a first input node, a second input node, a first output node, and a second output node and comprises:
a first NOR gate having a first input terminal coupled to the first input node, a second input terminal coupled to the second output node, and an output terminal coupled to the first output node; and
a second NOR gate having a first input terminal coupled to the first output node, a second input terminal coupled to the second input node, and an output terminal coupled to the second output node.

10. The comparison circuit as claimed in claim 9,
wherein the first time-to-digital comparator receives the first comparison signal and the second inverse comparison signal respectively at the first input node and the second input node of the first time-to-digital comparator and generates the first determination signal and the second determination signal respectively at the first output node and the second output node of the first time-to-digital comparator, and
wherein the second time-to-digital comparator receives the second comparison signal and the first inverse comparison signal respectively at the first input node and the second input node of the second time-to-digital comparator and generates the third determination signal and the fourth determination signal respectively at the first output node and the second output node of the second time-to-digital comparator.

11. The comparison circuit as claimed in claim 7 further comprising:
a determination unit for receiving the first determination signal, the second determination signal, the third determination signal, and the fourth determination signal and determining whether the voltage of the input signal is larger than the first middle voltage according to the first determination signal and the second determination signal or according to the third determination signal and the fourth inverse determination signal.

12. The comparison circuit as claimed in claim 11,
wherein the determination unit further receives the first comparison signal and the first inverse comparison signal, and
wherein when the first offset voltage is larger than the second offset voltage and the determination unit determines that the voltage of the input signal is larger than the first middle voltage, the determination unit determines whether the voltage of the input signal is larger than the first offset voltage according to the first comparison signal and the first inverse comparison signal.

13. The comparison circuit as claimed in claim 11,
wherein the determination unit further receives the second comparison signal and the second inverse comparison signal, and
wherein when the first offset voltage is larger than the second offset voltage and the determination unit determines that the voltage of the input signal is not larger than the first middle voltage, the determination unit determines whether the voltage of the input signal is larger than the second offset voltage according to the second comparison signal and the second inverse comparison signal.

14. The comparison circuit as claimed in claim 11,
wherein the determination unit further receives the second comparison signal and the second inverse comparison signal, and
wherein when the second offset voltage is larger than the first offset voltage and the determination unit determines that the voltage of the input signal is larger than the first middle voltage, the determination unit determines whether the voltage of the input signal is larger than the second offset voltage according to the second comparison signal and the second inverse comparison signal.

15. The comparison circuit as claimed in claim 11,
wherein the determination unit further receives the first comparison signal and the first inverse comparison signal, and
wherein when the second offset voltage is larger than the first offset voltage and the determination unit determines that the voltage of the input signal is not larger than the first middle voltage, the determination unit determines whether the voltage of the input signal is larger than the first offset voltage according to the first comparison signal and the first inverse comparison signal.

16. The comparison circuit as claimed in claim 7, wherein the each of the first comparator and the second comparator is implemented by a sense amplifier-based flip-flop.

17. The comparison circuit as claimed in claim 7 further comprising:
a calculation unit for receiving the first determination signal, the second determination signal, the third determination signal, and the fourth determination signal to generate a result signal and an inverse result signal, wherein the calculation unit comprises:
- a first NOR gate having a first input terminal receiving the first determination signal, a second input terminal receiving the third determination signal, and an output terminal outputting the result signal; and
- a second NOR gate having a first input terminal receiving the second determination signal, a second input terminal receiving the fourth determination signal, and an output terminal outputting the inverse result signal, wherein the result signal and the inverse result signal indicate whether the voltage of the input signal is larger than the first middle voltage.

18. The comparison circuit as claimed in claim 7 further comprising;
- a delay unit for receiving the second comparison signal and the second inverse comparison signal and delaying the second comparison signal and the second inverse comparison signal by a predetermined period; and
- a third time-to-digital comparator for receiving the first comparison signal and the second inverse comparison signal from the delay unit, and generating a fifth determination signal and a sixth determination signal according to the first comparison signal and the second inverse comparison signal, wherein when the first offset voltage is larger than second offset voltage, the fifth determination signal and the sixth determination signal indicate whether the voltage of the input signal is larger than a second middle voltage, and wherein the second middle voltage is determined according to the predetermined period of the delay unit.

19. The comparison circuit as claimed in claim 18, wherein the second middle voltage is equal to a half of the sum of the first offset voltage and the first middle voltage.

* * * * *